US012567569B2

(12) United States Patent
 Lian et al.

(10) Patent No.: US 12,567,569 B2
(45) Date of Patent: Mar. 3, 2026

(54) OPTICAL CABLE FOR INTERFEROMETRIC ENDPOINT DETECTION

(71) Applicant: Applied Materials, Inc., Santa Clara, CA (US)

(72) Inventors: Lei Lian, Fremont, CA (US); Pengyu Han, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 672 days.

(21) Appl. No.: 17/096,829

(22) Filed: Nov. 12, 2020

(65) Prior Publication Data

US 2022/0148862 A1 May 12, 2022

(51) Int. Cl.
 *G01B 11/06* (2006.01)
 *G01B 9/02015* (2022.01)
 (Continued)

(52) U.S. Cl.
 CPC .... *H01J 37/32963* (2013.01); *G01B 9/02015* (2013.01); *G01B 11/06* (2013.01);
 (Continued)

(58) Field of Classification Search
 CPC ........... H01J 37/32963; G01B 9/02015; G01B 11/0675; G01B 11/0683; G02B 6/02042; H01L 21/67253
 (Continued)

(56) References Cited

U.S. PATENT DOCUMENTS 4,611,919 A * 9/1986 Brooks, Jr. ........ G01B 11/0683
                                                        216/60
5,208,644 A * 5/1993 Litvak ............... H01J 37/32963
                                                        356/73
(Continued)

FOREIGN PATENT DOCUMENTS

JP        H10335307 A    12/1998
JP        2001093885 A    4/2001
       (Continued)

OTHER PUBLICATIONS

International Search Report and Written Opinion for PCT/US2021/056942 dated Feb. 16, 2022.
       (Continued)

*Primary Examiner* — Isiaka O Akanbi
(74) *Attorney, Agent, or Firm* — Patterson + Sheridan, LLP

(57) ABSTRACT

Disclosed herein is an endpoint detection having an optical bundle configured to emit light through a ceiling of a processing chamber. The optical bundle has a plurality of fibers configured to transmit the light from a light source towards a substrate and is configured to receive light reflected from the substrate. The plurality of fibers include a first emitting fiber and a first receiving fiber. The first receiving fiber is radially disposed at a pairing angle from the first emitting fiber, and is configured to receive light emitted from the first emitting fiber. The plurality of fibers further include a second emitting fiber and a second receiv-
       (Continued)

ing fiber. The second receiving fiber is radially disposed at the pairing angle from the second emitting fiber. The second receiving fiber is configured to receive light originating from the second emitting fiber. The pairing angle is between about 175 degrees and 185 degrees.

13 Claims, 5 Drawing Sheets

(51) Int. Cl.

| | | |
|---|---|---|
| *G02B 6/02* | (2006.01) | |
| *G02B 6/06* | (2006.01) | |
| *H01J 37/32* | (2006.01) | |
| *H01L 21/67* | (2006.01) | |

(52) U.S. Cl.
CPC ...... *G01B 11/0675* (2013.01); *G01B 11/0683* (2013.01); *G02B 6/02042* (2013.01); *G02B 6/06* (2013.01); *H01L 21/67063* (2013.01); *H01L 21/67253* (2013.01); *H01J 2237/334* (2013.01)

(58) Field of Classification Search
USPC ................................... 356/477, 451, 357, 72
See application file for complete search history.

(56) References Cited

U.S. PATENT DOCUMENTS

| | | | | |
|---|---|---|---|---|
| 6,406,641 | B1 * | 6/2002 | Golzarian .......... | G01B 11/0683 216/85 |
| 7,808,651 | B2 | 10/2010 | Lian et al. | |
| 8,747,686 | B2 | 6/2014 | Zheng et al. | |
| 9,601,396 | B2 | 3/2017 | Lian | |
| 11,424,115 | B2 * | 8/2022 | Bullock ................. | G01B 11/06 |

| | | | | |
|---|---|---|---|---|
| 2002/0183977 | A1 | 12/2002 | Sui et al. | |
| 2004/0043621 | A1 | 3/2004 | Nasser-Ghodsi | |
| 2006/0023218 | A1 * | 2/2006 | Jung ..................... | G01J 3/0251 356/73 |
| 2008/0014748 | A1 | 1/2008 | Perry | |
| 2008/0030740 | A1 * | 2/2008 | Wang ................. | A61B 5/14532 356/477 |
| 2008/0099435 | A1 * | 5/2008 | Grimbergen ...... | H01J 37/32963 216/60 |
| 2008/0176149 | A1 * | 7/2008 | Grimbergen .............. | C23F 4/00 216/60 |
| 2009/0218314 | A1 | 9/2009 | Davis et al. | |
| 2016/0007412 | A1 | 1/2016 | Busche et al. | |
| 2016/0266309 | A1 | 9/2016 | Takeuchi et al. | |
| 2019/0162526 | A1 * | 5/2019 | Williams ........... | G01B 9/02003 |
| 2020/0124399 | A1 | 4/2020 | Lian et al. | |
| 2022/0050303 | A1 * | 2/2022 | Han ....................... | G02B 27/30 |

FOREIGN PATENT DOCUMENTS

| | | |
|---|---|---|
| JP | 2002005635 A | 1/2002 |
| JP | 2006528428 A | 12/2006 |
| JP | 2020077866 A | 5/2020 |
| KR | 20100125370 A | 11/2010 |
| TW | 200943459 A | 10/2009 |
| TW | 201843753 A | 12/2018 |
| WO | 2021067239 A1 | 4/2021 |

OTHER PUBLICATIONS

Korean Office Action for Application No. 10-2023-7002036 dated May 26, 2025.
Taiwan Office Action for Application No. 110140868 dated Nov. 20, 2024.
Taiwan Office Action for Application No. 110140868 dated Jan. 31, 2024.

* cited by examiner

OPTICAL CABLE FOR INTERFEROMETRIC ENDPOINT DETECTION

BACKGROUND

Field

Examples of the present disclosure generally relate to an optical bundle and method of utilizing the same for use in an endpoint detection for etching semiconductor substrates.

Description of the Related Art

Semiconductor device geometries have dramatically decreased in size since such devices were first introduced several decades ago. The increasing circuit densities have placed additional demands on processes used to fabricate semi-conductor devices. For example, as circuit densities increase, the pitch size decreases rapidly to sub 50 nm dimensions, whereas the vertical dimensions such as trench depth remain relatively constant, with the result that the aspect ratios for the features, i.e., their height divided by width, increases. Precise control of the dimensions of such high density and sub-micron features is critical to the reliable formation of the semiconductor devices.

Features, such as transistors and capacitors are conventionally formed in the semiconductor device by patterning a surface of a substrate to define the lateral dimensions of the features and then etching the substrate to remove material and define the features. To form features with a desired electrical performance, the dimensions of the features must be formed within control specifications. Accordingly, it may be necessary to partially remove one or more layers using a dry etching or plasma etching process.

An interferometer measures the difference between two or more light paths by overlapping the residual light from both paths, generating interference fringes. Small changes in the range of the light source wavelength can be recognized. The reflected light is a combination of signals from each layer disposed on the substrate and special interference fringes are formed for each layer. For end point detection, the interference fringe pattern can be simulated for various layers and then compared during etching with the measured signal. The method is very effective and can be used to monitor etching and end point detection of substrates with multiple layers on top.

A fiber optic cable can be used to transmit from and receive light at the interferometer. The conventional fiber optic cable can measure parameters such as film quality, film thickness, or a width of structures on a substrate. In order to transmit and receive light signals in the same optical cable, a beam splitter may be used to separate the signals. Splitting the light signal can reduce the overall power of the signal, which requires amplification or filtering of the light signal. Manipulating the signal in this manner can introduce errors and lead to failure to detect or failure to accurately measure features on the substrate. As such, the conventional fiber optic cable can have low optical throughput and low spectral fidelity between processing chamber environments. Additional measures are required to reduce these problems, requiring increased chamber downtime and additional calibration processes.

Therefore, a need exists for an improved fiber cable for an endpoint detection system.

SUMMARY

Examples disclosed herein provide for an endpoint detection having an optical bundle configured to emit light through a ceiling of a processing chamber. The optical bundle has a plurality of fibers configured to transmit the light from a light source towards a substrate and is configured to receive light reflected from the substrate disposed in the processing chamber. The plurality of fibers include a first emitting fiber and a first receiving fiber. The first receiving fiber is radially disposed at a pairing angle from the first emitting fiber. The first receiving fiber is configured to receive light emitted from the first emitting fiber. The plurality of fibers further include a second emitting fiber and a second receiving fiber. The second receiving fiber is radially disposed at the pairing angle from the second emitting fiber. The second receiving fiber is configured to receive light originating from the second emitting fiber. The pairing angle is between about 175 degrees and about 185 degrees.

Examples presented herein further provide an endpoint detection system that includes a processing chamber having a ceiling, sidewalls, and a bottom defining an internal volume. A substrate support is located in the internal volume configured to support a substrate thereon. An optical bundle is disposed to emit light through a ceiling of the processing chamber. The optical bundle has a plurality of fibers configured to transmit the light from a light source and receive light from the substrate. The plurality of fibers include a first transmitting row that has a plurality of first emitting fibers configured to transmit light from a light source towards the substrate. The plurality of first emitting fibers include a first emitting fiber and a second emitting fiber. A first receiving row includes a plurality of first receiving fibers configured to receive reflected light originating from the transmitted light. The plurality of first receiving fibers including a first receiving fiber and a second receiving fiber. The first receiving fiber is configured to receive light emitted from the first emitting fiber. The second emitting fiber is configured to receive light emitted from the second receiving fiber. The first emitting fiber is radially disposed at a pairing angle from the first emitting fiber. The pairing angle is between about 175 degrees and about 185 degrees. The first transmitting row is separated from the first receiving row by an imaginary line dividing the optical bundle into substantially equal cross-sectional areas.

In another example, a semiconductor processing system has an optical bundle disposed to emit light through a ceiling of a processing chamber. The optical bundle has a plurality of fibers is configured to transmit the light from a light source towards a substrate disposed in the processing chamber. The plurality of fibers includes a first emitting fiber, a first receiving fiber, a second emitting fiber, and a second receiving fiber. A non-transitory computer readable medium stores instructions. The instructions, when executed by a processor, cause a controller coupled to the light source to perform a method. The method includes emitting a first light from the first emitting fiber. The method further includes receiving the first light at the first receiving fiber. The first receiving fiber is radially disposed at a pairing angle from the first emitting fiber. Further, the method includes emitting a second light from the second emitting fiber. The method includes receiving the second light at the second receiving fiber. The second receiving fiber is radially disposed at the pairing angle from the second emitting fiber. The second receiving fiber is configured to receive light originating from the second emitting fiber. The pairing angle is between about 175 degrees and about 185 degrees.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Examples of the present disclosure relate to an optical bundle and method of utilizing the same in an endpoint detection system configured for etching semiconductor substrates. Advantageously, the optical bundle disclosed herein enables an improved beam profile when emitted light is incident on a substrate. As such, a beam spot on the substrate that is created by the emitted light is produced at substantially the same area over the wavelength of the incident light, e.g., from about 200-800 nm. As such, the optical bundle collects reflected light more efficiently, reduces signal loss of the reflected light signal, and ensures that the reflected light signal has an overall larger magnitude than the conventional fiber optic cable. It is understood herein that the term "about" carries its plain meaning, as understood by one of ordinary skill in the art. As such, with respect to numeral ranges described herein, the term about may reasonably be interpreted as +/−10% of the value, magnitude, or degree the term modifies. The term should not be limited to this interpretation where such a construction would not reasonably be interpreted in by one of ordinary skill in the art.

Figure 1:
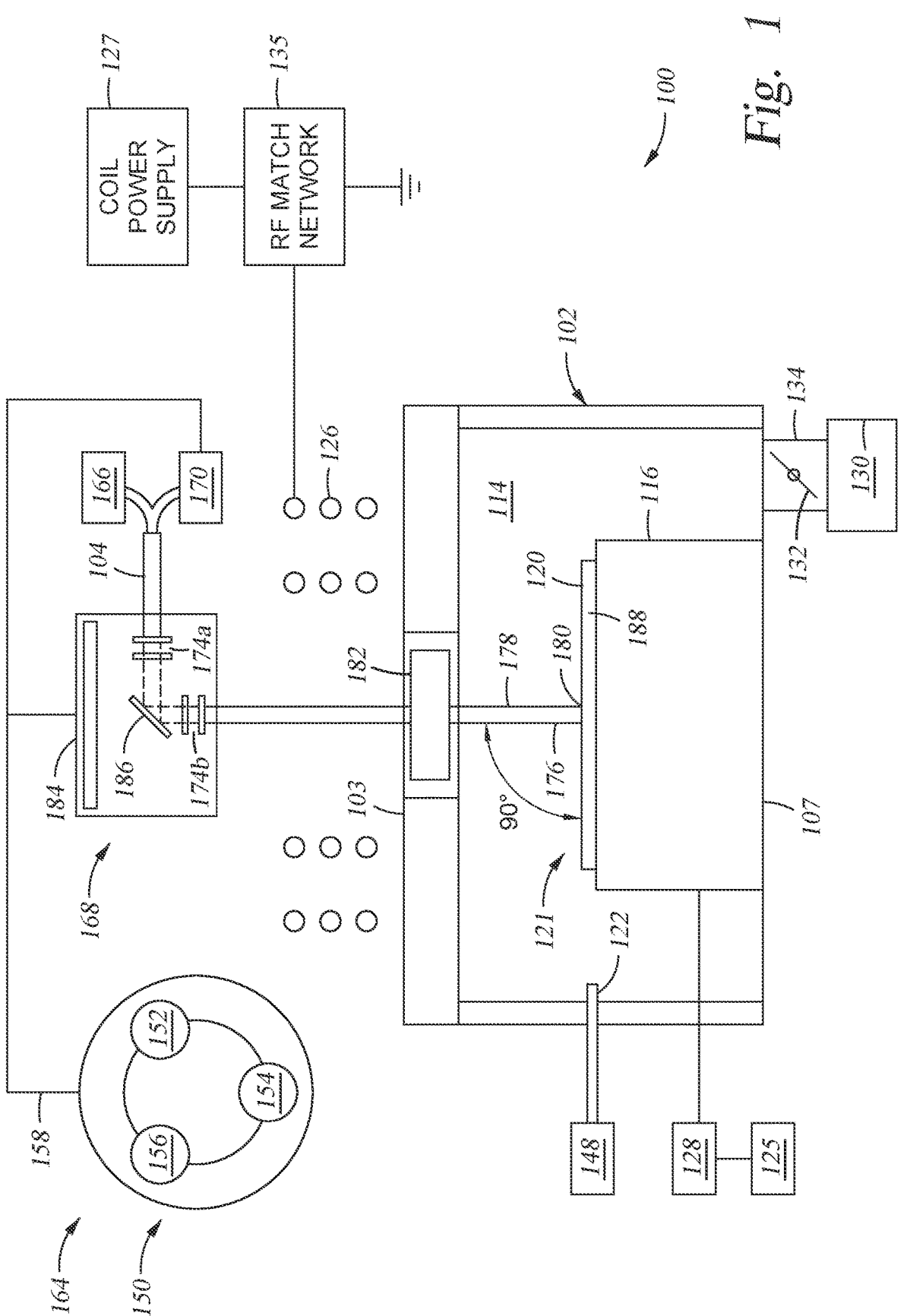
FIG. 1 is a schematic cross sectional view of a processing chamber having an optical bundle.

FIG. 1 is a schematic cross sectional view of a plasma processing chamber 100 having an optical bundle 104, in accordance with one example of the disclosure. Suitable processing chambers include inductively and capacitive coupled plasma etch chambers such as the TETRA® photomask etch system and the SYM3® etch system, both available from Applied Materials, Inc., of Santa Clara, California, among others. Other types of processing chambers may be adapted to benefit from the invention, including, for example, capacitive coupled parallel plate chambers, and magnetically enhanced ion etch chambers, as well as inductively coupled plasma etch chambers.

The processing chamber 100 includes a chamber body 102 and a ceiling 103 that is energy transparent, i.e., enabling energy and light to be transmitted therethrough. The chamber body 102 also has a chamber bottom 107. The chamber body 102 is fabricated from a metal, such as anodized aluminum or stainless steel. The ceiling 103 is mounted on the chamber body 102. The ceiling 103 may be flat, rectangular, arcuate, conical, dome or multi-radius shaped. The ceiling 103 is fabricated from an energy transparent material such as a ceramic or other dielectric material.

An inductive coil 126 is disposed over the ceiling 103 of the processing chamber 100, and is utilized to energize gases within the chamber 100 during processing.

A substrate support 116 is disposed in the processing chamber 100 having a substrate support surface 188 to support a substrate 120 during processing. The substrate support 116 may include an electrostatic chuck, with at least a portion of the substrate support 116 being electrically conductive and capable of serving as a process bias cathode.

Processing gases are introduced into the processing chamber 100 from a process gas source 148 through a gas distributor 122. The gas distributor 122 may be disposed in the ceiling 103 or chamber body 102, above the substrate support 116. Mass flow controllers (not shown) for each processing gas, or alternatively, for mixtures of the processing gas, are disposed between the gas distributor 122 and the process gas source 148 to regulate the respective flow rates of the process gases into the chamber body 102.

An interior volume 114 is defined in the chamber body 102 between the substrate support 116 and the ceiling 103. A plasma is formed in the interior volume 114 from the processing gases using a coil power supply 127 which supplies power to the inductive coil 126 to generate an electromagnetic field in the interior volume 114 through an RF match network 135. The substrate support 116 may include an electrode disposed therein, which is powered by an electrode power supply 125 and generates a capacitive electric field in the processing chamber 100 through an RF match network 128. RF power is applied to the electrode in the substrate support 116 while the chamber body 102 is electrically grounded. The capacitive electric field is transverse to the plane of the substrate support 116, and influences the directionality of charged species more normal to the substrate 120 to provide more vertically oriented anisotropic etching of the substrate 120.

Process gases and etchant byproducts are exhausted from the processing chamber 100 through an exhaust system 130. The exhaust system 130 may be disposed in the chamber bottom 107 of the processing chamber 100 or may be disposed in another portion of the chamber body 102 of the processing chamber 100 for removal of processing gases. A throttle valve 132 is provided in an exhaust port 134 for controlling the pressure in the processing chamber 100.

FIG. 1 further illustrates the optical bundle 104 configured to detect endpoint of an etching process or features within or on a substrate 120 disposed in a processing chamber 100. The optical bundle 104 is included in an endpoint detection system 164, in one example. The endpoint detection system 164 may be an interferometer endpoint (IEP) detection system. The endpoint detection system 164 is positioned to interface with the substrate 120 through a portion of the ceiling 103. In one example, the endpoint detection system 164 is positioned to interface with a peripheral portion of the substrate 120 through a portion of the ceiling 103 that is offset from the center of the ceiling 103

The endpoint of one or more stages of the etching process may be determined by the endpoint detection system 164, in one example. The endpoint of an etching stage may occur, for example, when a layer of the substrate 120 has been sufficiently removed, or etched through to reveal an underlying layer. In another example, the endpoint of the etching state can occur when a desired dimension, such as a desired height of a feature, has been obtained. Determination of the endpoint of the etching stage allows for etching of the substrate 120 to be halted once a stage has been completed, thus reducing the occurrence of overetching or underetching of the substrate 120. The endpoint of one or more of the stages may be determined by monitoring radiation emissions from plasma in the processing chamber 100, the plasma emitting radiation that changes in intensity and wavelength according to a change in the composition of the energized gas. For example, a change in composition of the energized gas can arise from the etching through of an overlying layer to expose an underlying layer on the substrate 120. As such, the endpoint detection system 164 monitors radiation emissions to determine the extent of etching of the substrate or other conditions in the process chamber 100.

The endpoint detection system 164 further includes a light source 166, a collimating assembly 168, a light detector 170, and a controller 150. The light source 166 is configured to emit a light beam through the optical bundle 104. The light beam impinges the substrate 120 and is reflected back through the optical bundle 104. The light beam returns to the light detector 170 upon passing through the optical bundle 104. For example, the collimating assembly 168 is configured to focus the light beam into an incident light beam 176. The incident light beam 176 passes through the ceiling 103 in a direction perpendicular to the substrate support surface 188 and illuminates an area or beam spot 180 on the surface 121 of the substrate 120. The incident light beam 176 is reflected by the surface 121 of the substrate 120 to form a reflected light beam 178. At least a portion of the reflected light beam 178 is directed in a direction perpendicular to the substrate support surface 188 back through the ceiling 103 to the light detector 170. The light detector 170 is configured to measure the intensity of the reflected light beam 178. An exemplary light detector 170 is a spectrometer. The controller 150 calculates portions of the real-time measured waveform spectra of reflected light beam 178 reflected from the beam spot 180 on substrate 120 and processes the spectra by using advanced spectral analysis techniques, including comparing the spectra with stored characteristic waveform patterns.

Alternatively, the optical bundle 104 can be used without the collimating assembly 168, such that the optical bundle 104 is coupled directly to the ceiling 103, having a single collimator disposed between the optical bundle 104 and the ceiling 103. For example, focusing lens 174*b* (i.e., as the collimator) can be disposed directly between the optical bundle 104 and the ceiling 103.

The light source 166 has a monochromatic or polychromatic light source that generates the incident light beam 176 used to illuminate the beam spot 180 on the substrate 120. The intensity of the incident light beam 176 is selected to be sufficiently high enough to enable the reflected light beam 178 to have a measurable intensity. In one example, the light source 166, such as an Xe lamp, provides a polychromatic light and generates an emission spectrum of light in wavelengths from about 200 nm to about 800 nm. The polychromatic light source 166 can be filtered to select the frequencies comprising the incident light beam 176. Color filters can be placed in front of the light detector 170 to filter out all wavelengths except for the desired wavelength(s) of light, prior to measuring the intensity of the reflected light beam 178 entering the light detector 170. The light source 166 can also include a monochromatic light source, for example an He—Ne or ND-YAG laser that provides a selected wavelength of light.

One or more focusing lenses 174*a*, 174*b* may be used to collimate the incident light beam 176 from the light source 166 to form the beam spot 180 on the surface 121 of the substrate 120, and to focus the reflected light beam 178 back on an active surface of the light detector 170. The size or area of the beam spot 180 should be sufficiently large to compensate for variations in surface topography of the substrate 120 and device design features. The size of the beam spot 180 enables detection of etch endpoints at target depth for design features having small openings, such as vias or narrow trenches (e.g., 248 in FIG. 2), which may be densely present or more isolated. The area of the reflected light beam is sufficiently large to activate a large portion of the active light-detecting surface of the light detector 170.

The incident and reflected light beams 176, 178 are directed through a transparent window 182 of the processing chamber 100. The transparent window 182 allows the light beams 176, 178 to pass in and out of the processing environment of the processing chamber 100. The substrate support surface 188 of the substrate support 116 on which the substrate 120 rests is disposed parallel to the ceiling 103 and perpendicular (90°) to the light beams 176, 178.

In one example, the transparent window 182 is located in the ceiling 103 of the processing chamber 100, oriented relative to the substrate 120 and the substrate support 116. The transparent window 182 is configured to receive an incident light beam from the endpoint detection system 164. The transparent window 182 enables transmission of the incident light beam 176 to the substrate 120 at an angle perpendicular to the substrate 120 and the substrate support 116. The transparent window 182 also enables the reflected light beam 178 to pass therethrough upon reflection from the substrate 120. The transparent window 182 is further configured to transmit the reflected light beam 178 to the endpoint detection system 164 at an angle perpendicular to the endpoint detection system 164.

The diameter of the beam spot 180 is about 2 mm to about 10 mm, in one example. However, if the beam spot 180 encompasses large isolated areas of the substrate having only a small number of etched features, it may be necessary to use a smaller beam spot 180 in order to focus on the features of interest. The size of the beam spot can therefore be optimized, depending on the design features for a particular substrate 120.

Optionally, a light beam positioner 184 may be used to move the incident light beam 176 across the substrate 120 to locate a suitable portion of the substrate surface on which to position the beam spot 180 to monitor an etching process. The light beam positioner 184 may include one or more primary mirrors 186 that rotate at small angles to deflect light beam from the light source 166 onto different positions of the substrate surface. Additional secondary mirrors may be used (not shown) to intercept the reflected light beam 178 that is reflected from the substrate 120 surface and focus the reflected light beam 178 on the light detector 170. The light beam positioner 184 may also be used to scan the light beam in a raster pattern across the substrate 120 surface. In this version, the light beam positioner 184 includes a scanning assembly having a movable stage (not shown), upon which the light source 166, the collimating assembly 168 and the light detector 170 are mounted. The movable stage can be moved through set intervals by a drive mechanism, such as a stepper motor, to move the beam spot 180 across the substrate 120 surface.

The light detector 170 includes a light-sensitive electronic component, such as a charge coupled device (CCD), photodiode, or phototransistor, which provides a signal in response to a measured intensity of the reflected light beam 178. Accordingly, the reflected light beam 178 is reflected from the surface 121 of the substrate 120. The signal can be in the form of a change in the level of a current passing through an electrical component or a change in a voltage applied across an electrical component. The reflected light beam 178 undergoes constructive and/or destructive interference which increases or decreases the intensity of the light beam. As such, the light detector 170 provides an electrical output signal in relation to the measured intensity of the reflected light beam 178. The electrical output signal is plotted as a function of time to provide waveform spectra having numerous waveform patterns corresponding to the varying intensity of the reflected light beam 178.

A computer program coupled to the controller 150 compares the shape of the measured waveform pattern of the reflected light beam 178 to a stored characteristic waveform pattern and determines the endpoint of the etching process when the measured waveform pattern is the same as the characteristic waveform pattern. As such, the period of interference signal as a function of time may be used to calculate the depth and etch rate. The program may also operate on the interference trends to detect a characteristic pattern, such as, an inflection point. The operations can be simple mathematic operations, such as evaluating a moving derivative to detect an inflection point.

Although the endpoint detection system 164 is positioned to interface with the substrate 120 through a portion of the ceiling 103, which is substantially horizontal, the endpoint detection system 164 can be located horizontally above the processing chamber 100. Accordingly, the endpoint detection system 164 further includes a folding mirror above the chamber 100 to bend the incident light beam 176 and the reflected light beam 178 from a vertical position to the horizontal position. The transparent window 182 may be placed on a side of the chamber 100 or a bottom of the chamber 100.

A controller 150 is coupled to the endpoint detection system 164. The controller 150 includes a processor 152, a memory 154, and support circuits 156 that are coupled to one another. The controller 150 is electrically coupled to the endpoint detection system 164, including light detector 170, controller 150, and the light source 166 via a wire 158.

The processor 152 may be one of any form of general purpose microprocessor, or a general purpose central processing unit (CPU), each of which can be used in an industrial setting, such as a programmable logic controller (PLC), supervisory control and data acquisition (SCADA) systems, or other suitable industrial controller. The memory 154 is non-transitory and may be one or more of readily available memory such as random access memory (RAM), read only memory (ROM), or any other form of digital storage, local or remote. The memory 154 contains instructions, that when executed by the processor 152, facilitates execution of the method 500. The instructions in the memory 154 are in the form of a program product such as a program that implements the method of the present disclosure. The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

Figure 2:
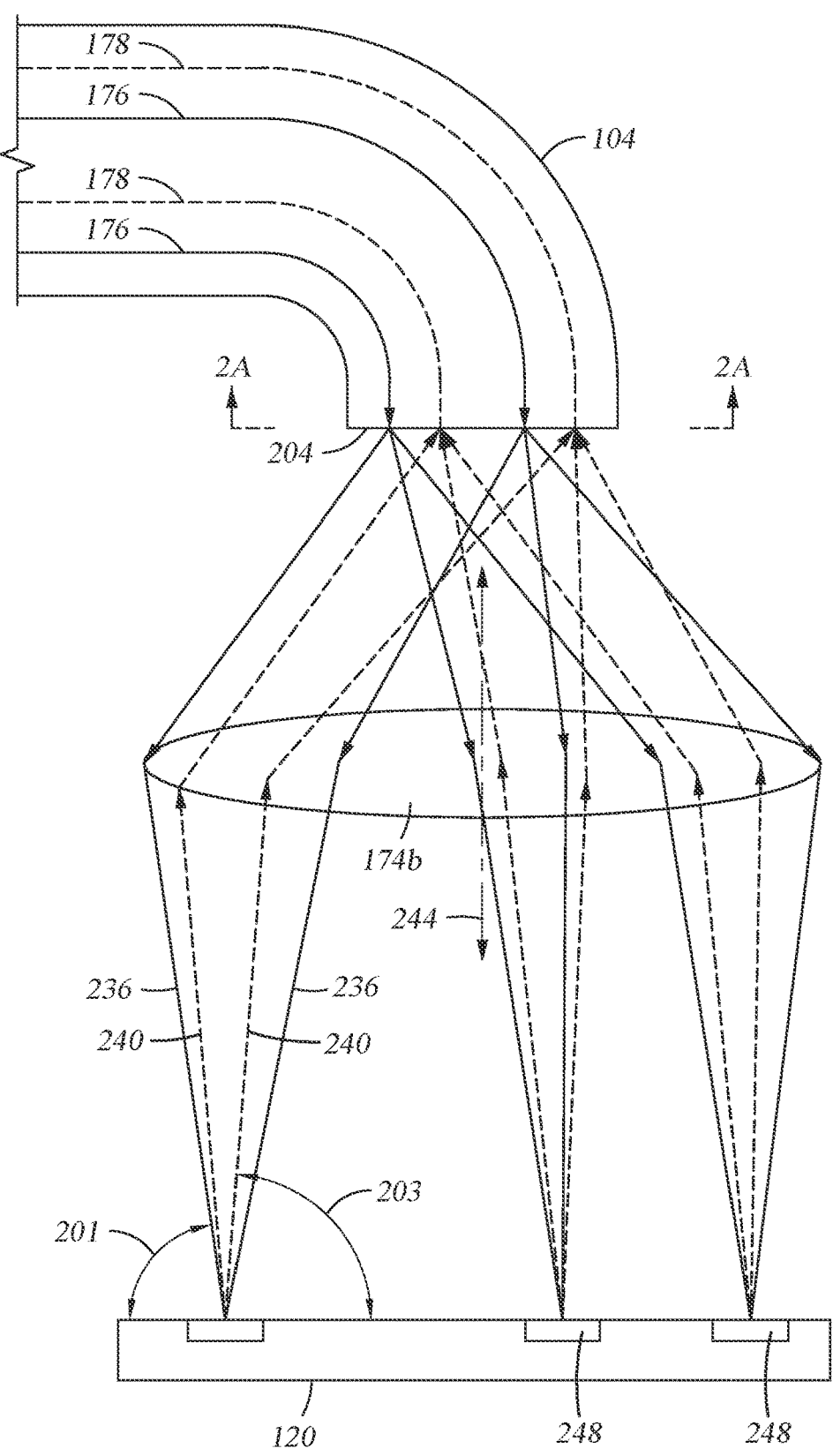
FIG. 2 is a plan view of the optical bundle configured to transmit and receive light in the processing chamber shown in FIG. 1.
Figure 2A:
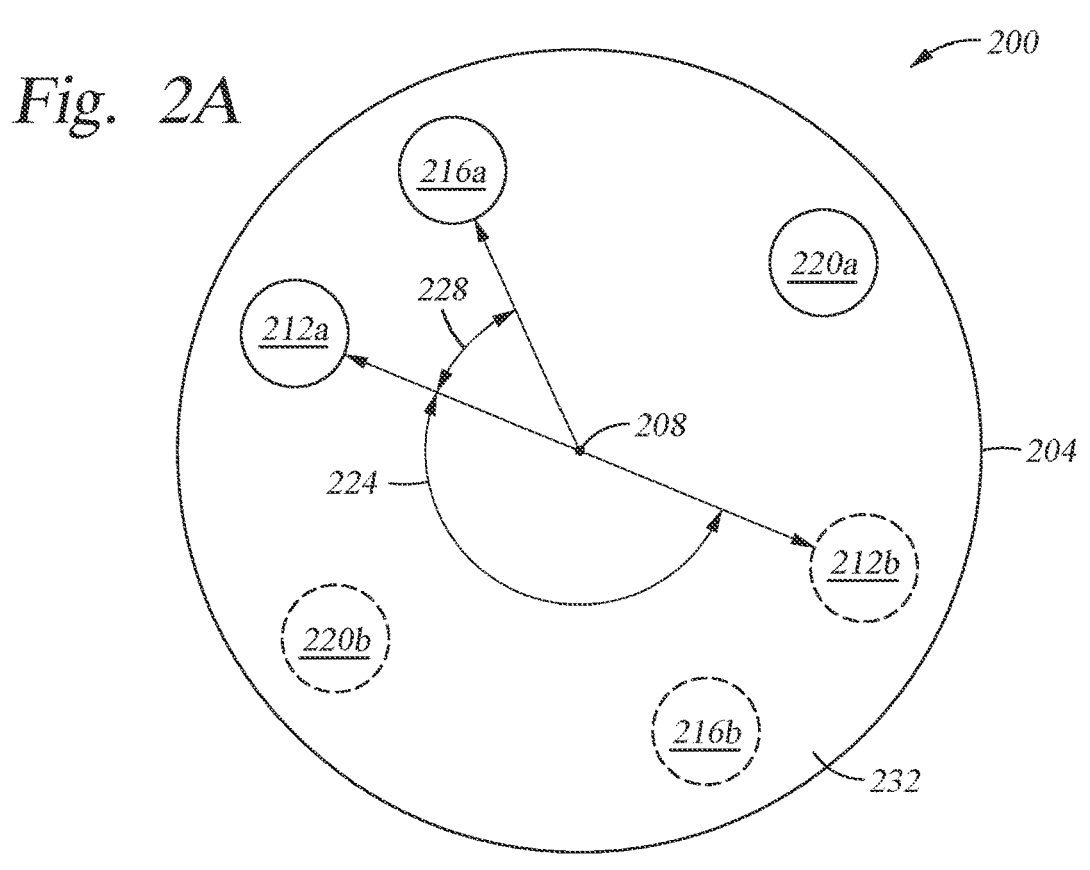
FIG. 2A is a cross-sectional view of an opening of the optical bundle, taken along line A-A.

FIG. 2 is a plan view of the optical bundle 104 configured to transmit and receive light in the processing chamber shown in FIG. 1. FIG. 2A is a cross-sectional view of an opening 204 of the optical bundle 104, taken along line A-A. The incident light beam 176, originating at the light source 166, exits the optical bundle 104 and passes through the focusing lens 174b. Upon passing through the focusing lens 174b, the incident light beam 176 becomes rays of incident light 236 that are substantially parallel to one another. The opening 204 of the optical bundle 104 is positioned at or near the focal point of the focusing lens 174b. Hence, rays of incident light 236 become substantially parallel and collimated before contacting the substrate 120 at an incident angle 201. The incident angle 201 is created by offsetting the opening 204 of the optical bundle 104 from a center 244 of the focusing lens 174b. After impinging the substrate 120, the incident light beam 176, as rays of incident light 236, is reflected back towards the optical bundle 104 as rays of reflected light 240. Collectively, the rays of reflected light 240 make up the reflected light beam 178. The rays of reflected light 240 are returned to the focusing lens 174b at a reflected angle 203. After passing through the focusing lens 174b, the rays of reflected light 240 are returned to the optical bundle 104. In one example, the optical bundle 104 can be concentric with the focusing lens 174b. The optical bundle 104 optical bundle has a diameter between about 0.20 mm and 1.50 mm, in one example.

A plurality of fibers 200 are shown terminating at the opening 204 of optical bundle 104. In order to aid the description of the disclosure, the opening 204 illustrating the plurality of fibers 200 has been rotated by 90 degrees with respect to the substrate 120. The plurality of fibers 200 are arranged around the center 208 of the opening 204 of the optical bundle 104. In a non-limiting example, the plurality of fibers 200 is illustrated having three pairs of fibers, however it is understood that additional pairs can be included in the plurality of fibers 200 without departing from the disclosure. An insulating material 232 is disposed within the optical bundle 104. The insulating material 232 separates each fiber of the plurality of fibers 200, such that interference or cross-talk between adjacent fibers is minimized or substantially eliminated. The insulating material 232 also maintains a position of each fiber relative to the remaining plurality of fibers, such that the pairs of fibers remain aligned, as described below.

A first emitting fiber 212a is radially separated from a first receiving fiber 212b by a pairing angle 224. Because the insulating material 232 maintains the relative position between the plurality of fibers 200, a second emitting fiber 216a is radially separated from a second receiving fiber 216b by the pairing angle 224, and a third receiving fiber 220b is separated from a third emitting fiber 220a by the pairing angle 224. The pairing angle 224 is between about 175 degrees and about 185 degrees. In one example, the pairing angle 224 is 180 degrees. The first emitting fiber 212a is separated from the second emitting fiber 216a by a separation angle 228. Additionally, the second emitting fiber 216a is separated from the third emitting fiber 220a by the separation angle 228. In yet another example, the pairs of fibers are symmetrical about the center 208 of the optical bundle 104.

In one example, the separation angle 228 is equal between each fiber of the plurality of fibers 200. In another example, the separation angle 228 between each fiber of the plurality of fibers 200 can be different. For example, the separation angle 228 between the first emitting fiber 212a and the second emitting fiber 216a may be less than or greater than the separate angle 228 between the second emitting fiber 216a and the third emitting fiber 220a. So long as each emitting fiber is paired with its respective receiving fiber, the separation angle 228 can be any angle less than ±180 degrees. The separation angle 228 in one example is equal to N+1/180 degrees, where N is equal to the number of emitting fibers in the plurality of fibers 200. In another example, the separation angle 228 is greater than N+1/180 degrees, and in yet another example, the separation angle 228 is less than N+1/180 degrees. The separation angle 228 can be about 0.25 degrees and less than about 180 degrees, such as about 5 degrees and less than about 180 degrees.

As noted the insulating material 232 pairs a light emitting fiber with a corresponding light receiving fiber. As such, after reflection from the substrate 120, each ray of incident light 236 projected from the first emitting fiber 212a is returned as a ray of reflected light 240 to the first receiving fiber 212b. Similarly, each ray of incident light 236 originating at the second emitting fiber 216a is reflected as a ray of reflected light 240 to the second receiving fiber 216b. Additionally, each ray of incident light 236 projected from the third emitting fiber 220a is returned as a ray of reflected light 240 to the third receiving fiber 220b. Each pair of the plurality of fibers 200 can transmit rays of incident light 236 and/or receive rays of reflected light 240 independently of the other pairs. In a non-limiting example, the first emitting fiber 212a can transmit rays of incident light 236 independently of the second emitting fiber 216a. As such, the second receiving fiber 216b receives light independently from the first receiving fiber 212b. As such, substantially all of each ray of incident light emitted by the emitting fiber is received by the respective receiving fiber, such that the intensity of the incident light beam 176 is maintained in the intensity of the reflected light beam 178. Accordingly, the optical bundle 104 advantageously provides greater fidelity of the overall light intensity associated with above-noted parameters that detected and measured endpoint detection system 164.

Rays of reflected light 240 are transmitted through the optical bundle 104, as the reflected light beam 178, to the light detector 170. As previously noted, the light detector 170 is a spectrometer in one example. Advantageously, the optical bundle 104 maximizes an intensity of the reflected light beam 178 collected by the light detector 170, because reflected light beam 178 has substantially the same light intensity as the incident light beam 176 when the plurality of fibers 200 are paired, as disclosed herein. Compared with the conventional fiber optic cable, the optical bundle 104 has less light intensity loss between transmitted and received light than the conventional systems that may employ beam splitters or non-paired fibers. While the plurality of fibers 200 show one concentric row of fibers, it is understood that the optical bundle 104 is not limited to the number of rows shown, and that the numbers of rows can be increased inversely with the diameter of each fiber and/or proportional to the diameter of the optical bundle 104. The diameter of each fiber is between about 0.01 micrometers to about 400 micrometers.

Figure 3:
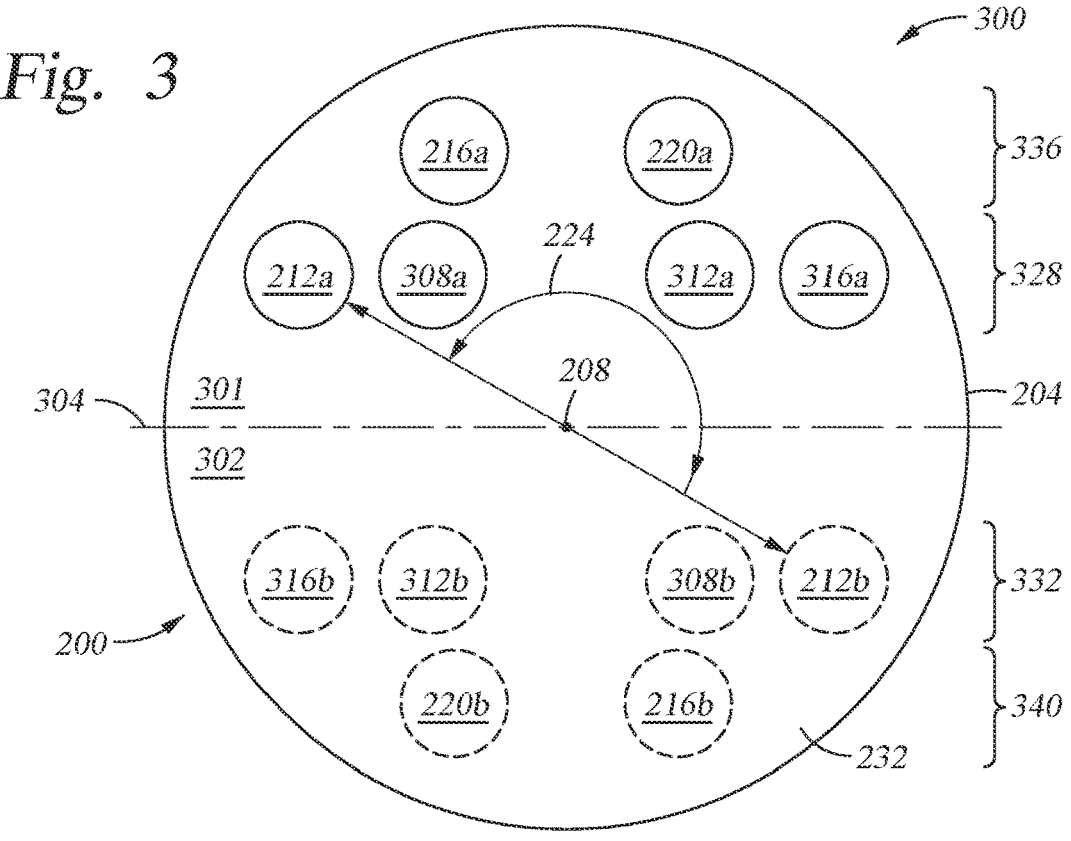
FIG. 3 is a plan view of an alternative configuration of the optical bundle shown in FIG. 2.

FIG. 3 is a plan view of an alternative configuration of the optical bundle 104. The plurality of fibers 200 are arranged in paired fiber rows 300. A centerline 304 bifurcates the paired fiber rows 300 into an emitting section 301 and a receiving section 302. As illustrated, the paired fiber rows 300 include a first emitting row 328 paired to a first receiving row 332, and a second emitting row 336 paired to a second receiving row 340. For simplicity, the first emitting row 328 is discussed in a left to right order having the first emitting fiber 212a, a fourth emitting fiber 308a, a fifth emitting fiber 312a, and a sixth emitting fiber 316a. The first receiving row 332 is ordered from left to right with the sixth receiving fiber 316b, the fifth receiving fiber 312b, and the fourth receiving fiber 308b, and the first receiving fiber 212b. Because the pairs of fibers (e.g., first emitting fiber 212a and first receiving fiber 212b) are symmetric about the center 208, the ordering of the fiber pairs ensures that the pairs of fibers are aligned. Additionally, the first emitting row 328 is a same distance from the centerline 304 as the first receiving row 332. As such, the centerline 304, i.e. an imaginary line, divides the optical bundle 104 into substantially equal cross-sectional areas. The pairing angle 224 is between about 175 degrees and about 185 degrees, and in one example, the pairing angle 224 is about 180 degrees.

The second emitting fiber 216a and the third emitting fiber 220a are disposed in the second emitting row 336. The second receiving row 340 has the third receiving fiber 220b and the second receiving fiber 216b arranged therein. The second emitting row 336 is further from the centerline 304 than the first emitting row 328. Accordingly, the second receiving row 340 is further away from the centerline 304 than the first receiving row 332. The second emitting row 336 is the same distance from the centerline 304 as the second receiving row 340. Ordering of the pairs of fibers ensures that each emitting fiber and receiving fiber, of the paired fiber rows 300, are aligned, thus aligning the plurality of fibers 200. Aligning the plurality of fibers 200 as disclosed herein enables an intensity strength of incident light beam 176 to be maintained within the reflected light beam 178, as the reflected light beam 178 returns to the optical bundle 104. Advantageously, the amount of light transmitted onto the substrate 120 and reflected back to light detector 170 (e.g., a spectrometer) through the optical bundle 104 scales up linearly with increasing the number of pairs of fibers.

Figure 4:
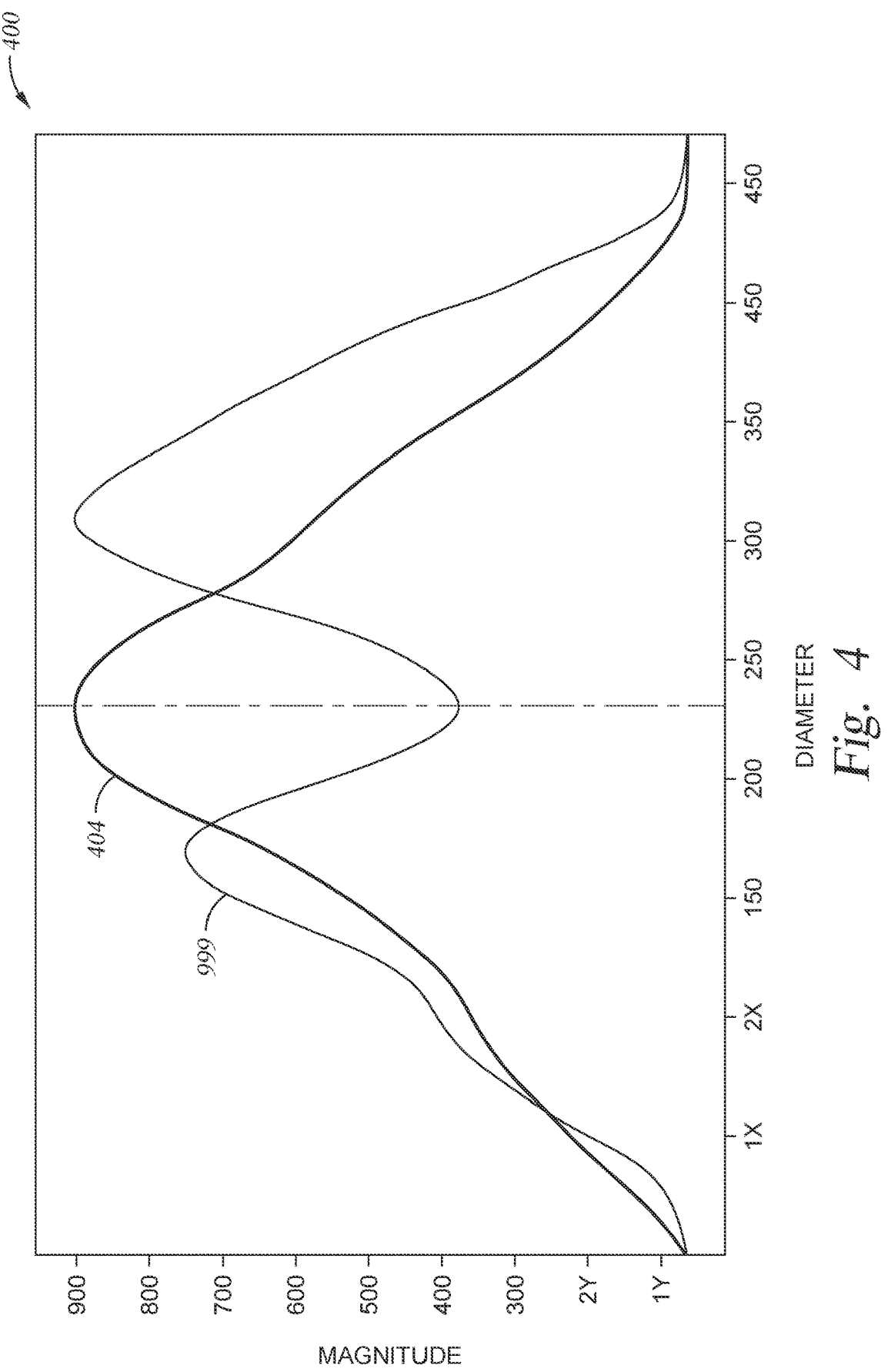
FIG. 4 is a graph illustrating profile of light received by the optical bundle compared to a conventional fiber optic cable.

FIG. 4 is a graph 400 showing the profile of light received by the optical bundle 104 compared to a conventional fiber optic cable. The abscissa corresponds to a diameter of the optical bundle 104 and the ordinate corresponds to a magnitude of an intensity of light received at the light detector 170. An exemplary value of x on the abscissa can be any value between about 1 and about 20. The value of y on the ordinate can have a value between about 10 and about 200, such as about 50, or about 100, or 150. The graph 400 shows an intensity profile 404 of the optical bundle 104 with respect to a diameter of the optical bundle 104, such as the center 208. The diameter of the optical bundle 104 can be between about 0.20 mm and 1.50 mm, such as about 0.25 mm or about 0.55 mm. The intensity profile 404 is substantially Gaussian having a single peak at or near the center of the optical bundle 104. Beneficially, the spectra or shape of the intensity curve is substantially the same between processing chambers, therefore reducing the time needed to calibrate the light detector 170 or controller 150 across processing chambers that utilize the optical bundle 104.

As detailed above, the plurality of fibers 200 shown in FIGS. 2 and 3 enable a greater proportion of the intensity signal of the light to be maintained as light originating at the light source 166 is returned and measured at the light detector 170. Beneficially, when the incident light beam 176 is projected at the incident angle 201 on the substrate 120, the intensity profile 404 has peak intensity at the center 208 of the optical bundle 104. A conventional intensity profile 999 has two intensity peaks, because the conventional fiber optic cable does not have paired fibers, resulting in loss of overall intensity of the reflected light. Moreover, utilizing the conventional fiber optic cable, the beam spot produced on the substrate will vary with the magnitude of the intensity signal, as the wavelength of the light changes.

Figure 5:
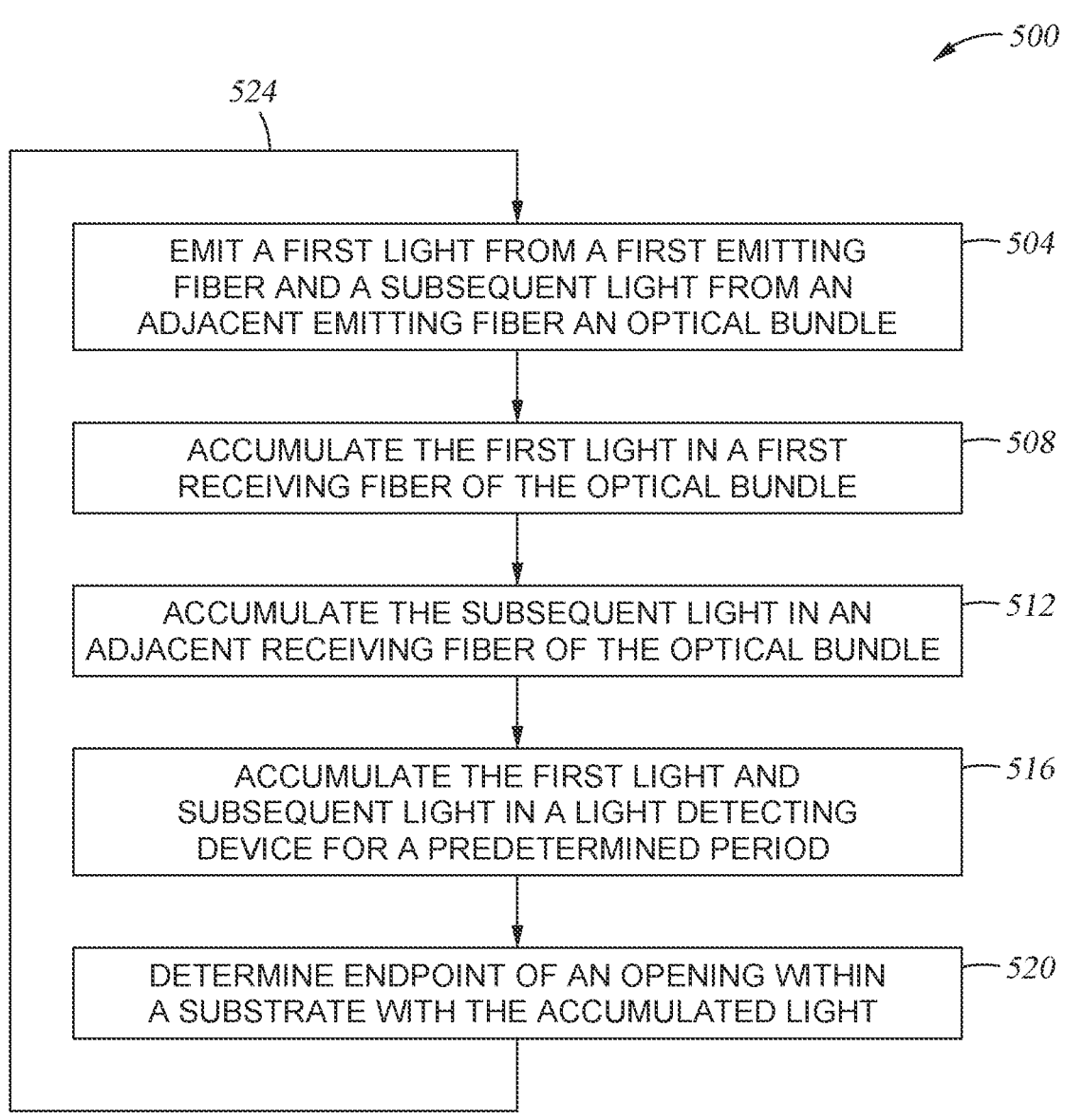
FIG. 5 is flow diagram of a method of collecting reflected light within the processing chamber utilizing the optical bundle shown in FIGS. 1-3.

FIG. 5 is flow diagram of a method of collecting reflected light from a substrate utilizing the optical bundle disclosed herein. The method begins at operation 504 where a first light is emitted from a first emitting fiber and a subsequent light is emitted from an adjacent emitting fiber an optical bundle. For example, a ray of incident light is emitted from the first emitting fiber 212*a*, and a subsequent ray of incident light is emitted from the second emitting fiber 216*a*. Proceeding to operation 508, a first light is accumulated in a first receiving fiber of the optical bundle. The optical bundle 104 is one example of the optical bundle that can perform the method 500. For example, the reflected light beam 178 is accumulated in the first receiving fiber 212*b*, because the first receiving fiber 212*b* is paired, i.e., aligned in a radial direction with the first emitting fiber 212*a*. As such, when the incident light beam 176 is emitted by the first emitting fiber 212*a*, the incident light beam 176 is reflected by the surface 121 of the substrate 120 to form the reflected light beam 178 that is received by the first receiving fiber 212*b*.

As shown in FIGS. 2-3, and described above, the first receiving fiber 212*b* is offset by the pairing angle 224 in the radial direction from the first emitting fiber 212*a*. Additionally, the first receiving fiber 212*b* and the first emitting fiber 212*a* are paired, i.e., separated by the pairing angle 224. The pairing angle 224 is between about 175 degrees and about 185 degrees, such as about 180 degrees, so that substantially all intensity of light from the incident light beam 176 is received at the first receiving fiber 212*b* as the reflected light beam 178.

At operation 512, another light beam is accumulated in an adjacent receiving fiber of the optical bundle 104. For example, the reflected light beam 178 is accumulated in second receiving fiber 216*b* when the incident light beam 176 emitted by the second emitting fiber 216*a* is reflected from the surface 121 of the substrate 120, as illustrated in FIGS. 2 and 3. The reflected light beam 178 is accumulated by the third receiving fiber 220*b* when incident light beam 176, originating from the third emitting fiber 220*a*, is reflected from the substrate 120 and received at the third receiving fiber 220*b*. More specifically, the rays of reflected light 240 are received at the second receiving fiber 216*b* after the rays of incident light 236 are projected toward the substrate 120 by the second emitting fiber 216*a*. As such, each pair of fibers (e.g., second emitting fiber 216*a* and second receiving fiber 216*b*) can emit and receive light beams 176, 178 independently. Otherwise stated, the transmission and receipt of the light beams 176, 178 by paired fiber bundles occurs continuously and substantially simultaneously.

As described above, each of the pairs of fibers is bundled. As such, second receiving fiber 216*b* is offset in a radial direction from the first emitting fiber 212*a*, and the third receiving fiber 220*b* is offset in a radial direction from the third emitting fiber 220*a* by between about 175 degrees and about 185 degrees, such as about 180 degrees, as shown in FIGS. 2 and 3.

At operation 516, the first light and all emitted rays of reflected light are accumulated in the light detector 170 for a predetermined period of time. The reflected light beam 178 is accumulated at the light detector 170. For example, the rays of reflected light 240 are returned to the optical bundle 104 after passing through the focusing lens 174*b*.

Proceeding to operation 520, the method 500 continues by determining an endpoint of an opening 248 within the substrate 120. For example, an endpoint of the opening in the substrate 120 is determined by an algorithm or computer program loaded on to the controller 150.

Proceeding to operation 524, the method returns to operation 512, where additional fiber pairs are offset and additional light is accumulated for a predetermined time. It is understood that the terms "another," "subsequent," or "additional" do not necessitate a time dependent order of operations of emitting the incident light beam 176 and receiving the reflected light beam 178.

Disclosed herein are examples of an optical bundle and method of utilizing the same for use in an endpoint detection system for etching semiconductor substrates. Advantageously, the optical bundle enables the intensity of the incident light beam to be maintained in the reflected light beam measured by the light detector, thus enabling more precise detection of feature endpoints within the substrate. While the foregoing is directed to specific examples, other examples may be devised without departing from the scope of the disclosure.

What we claim is:

1. An endpoint detection system, comprising:
an optical bundle configured to emit light through a ceiling of a processing chamber, the optical bundle having a plurality of fibers arranged around a center, the plurality of fibers configured to transmit the light from a light source towards a substrate and configured to receive light reflected from the substrate disposed in the processing chamber, the plurality of fibers comprising:
a plurality of emitting fibers; and
a plurality of receiving fibers, where each receiving fiber of the plurality of receiving fibers is paired with a respective emitting fiber of the plurality of emitting fibers, and
wherein each receiving fiber is disposed at a pairing angle from the respective emitting fiber and wherein the pairing angle extends through the center at an angle between about 175 degrees and about 185 degrees.

2. The endpoint detection system of claim 1, further comprising:
a collimator disposed between the optical bundle and a substrate support configured to support the substrate, the collimator configured to focus the light emitted from the optical bundle.

3. The endpoint detection system of claim 2, wherein the optical bundle has a diameter between about 0.20 mm and 1.50 mm.

4. The endpoint detection system of claim 1, wherein a first fiber of the plurality of fibers is disposed at a separation angle from an adjacent fiber of the plurality of fibers, wherein the separation angle is less than the pairing angle.

5. The endpoint detection system of claim 1, wherein a diameter of each fiber of the plurality of fibers is substantially equal to a diameter of the fourth emitting fiber, and the diameter is between about 0.01 micrometers to about 400 micrometers.

6. The endpoint detection system of claim 1, wherein the optical bundle further comprises:
an insulation material that surrounds each fiber of the plurality of fibers, the insulation material configured to maintain the pairing angle.

7. An endpoint detection system, comprising:
a processing chamber having a ceiling, sidewalls, and a bottom defining an internal volume;
a substrate support located in the internal volume configured to support a substrate thereon;

an optical bundle disposed to emit light through a ceiling
of the processing chamber, the optical bundle having a
plurality of fibers arranged around a center, the plural-
ity of fibers configured to transmit the light from a light
source and receive light from the substrate, the plurality
of fibers comprising:
  a first transmitting row comprising a plurality of first
    emitting fibers configured to transmit light from a
    light source towards the substrate; and
  a first receiving row comprising a plurality of first
receiving fibers configured to receive reflected light
    originating from the transmitted light, the plurality of
    first receiving fibers configured to receive light emit-
    ted from the plurality of first emitting fibers, the
    plurality of first receiving fibers and the plurality of
first emitting fibers are radially disposed about the
    center and each first emitting fiber of the plurality of
    first emitting fibers have a pairing angle from a
    respective first receiving fiber of the plurality of first
    receiving fibers wherein the pairing angle extends
through the center, the pairing angle being between
    about 175 degrees and about 185 degrees.

8. The endpoint detection system of claim 7, further
comprising:
  a collimator disposed between the optical bundle and the
substrate support, the collimator configured to focus the
    light emitted from the optical bundle.

9. The endpoint detection system of claim 8, wherein the
optical bundle has a diameter between about 0.20 mm and
1.50 mm.

10. The endpoint detection system of claim 7, wherein the
optical bundle further comprises:
  an insulation material that surrounds the plurality of
    fibers, the insulation material configured to maintain
    the pairing angle.

11. The endpoint detection system of claim 7, wherein the
plurality of fibers further comprises:
  a second transmitting row comprising a plurality of sec-
    ond emitting fibers configured to transmit light from the
    light source towards the substrate support, and
a second receiving row comprising a plurality of second
    receiving fibers configured to receive reflected light
    originating from the transmitted light, the plurality of
    second receiving fibers and the plurality of second
    emitting fibers are radially disposed about the center
and concentric with the plurality of first receiving fibers and the plurality of first emitting fibers, wherein each
second emitting fiber of the plurality of second emitting
fibers is paired at the pairing angle from a respective
second receiving fiber of the plurality of second receiv-
ing fibers.

12. A semiconductor processing system, comprising:
an optical bundle disposed to emit light through a ceiling
of a processing chamber, the optical bundle having a
plurality of fibers disposed about a center and config-
ured to transmit the light from a light source towards a
substrate disposed in the processing chamber, the plu-
rality of fibers comprising a first plurality of emitting
fibers and a plurality of receiving fibers, wherein each
receiving fiber of the plurality of receiving fibers is
disposed at a pairing angle from a respective emitting
fiber of the plurality of emitting fibers and wherein the
pairing angle extends through the center at an angle
between about 175 degrees and about 185 degrees;
a non-transitory computer readable medium storing
instructions, the instructions when executed by a pro-
cessor cause a controller coupled to the light source to
perform a method, the method comprising:
  emitting a first light from a first emitting fiber of the
    plurality of emitting fibers;
  receiving the first light at a respective first receiving
    fiber of the plurality of fibers, the respective first
    receiving fiber radially disposed at a pairing angle
    from the first emitting fiber;
  emitting a second light from a second emitting fiber of
    the plurality of emitting fibers; and
  receiving the second light at the second receiving fiber,
    the second receiving fiber radially disposed at the
    pairing angle from the second emitting fiber, the
    second receiving fiber configured to receive light
    originating from the second emitting fiber, wherein
    the pairing angle through the center is between about
    175 degrees and about 185 degrees.

13. The semiconductor processing system of claim 12,
wherein the method further comprises:
  passing the first light and the second light through a
    collimator, the collimator disposed between the optical
    bundle and a substrate support for supporting the
    substrate thereon, the collimator configured to focus the
    first light and the second light.

* * * * *